United States Patent
Guenter

(10) Patent No.: US 7,359,419 B2
(45) Date of Patent: Apr. 15, 2008

(54) VERTICAL CAVITY SURFACE EMITTING LASER OPTIMIZED FOR THERMAL SENSITIVITY

(75) Inventor: James K. Guenter, Garland, TX (US)

(73) Assignee: Finisar Corporation, Sunnyvale, CA (US)

( * ) Notice: Subject to any disclaimer, the term of this patent is extended or adjusted under 35 U.S.C. 154(b) by 60 days.

(21) Appl. No.: 11/093,240

(22) Filed: Mar. 29, 2005

(65) Prior Publication Data
US 2005/0286587 A1  Dec. 29, 2005

Related U.S. Application Data

(63) Continuation-in-part of application No. 10/877,915, filed on Jun. 25, 2004, now Pat. No. 7,184,454.

(60) Provisional application No. 60/605,875, filed on Aug. 31, 2004.

(51) Int. Cl.
*H01S 5/00* (2006.01)
(52) U.S. Cl. .............. 372/50.1; 372/43.01; 372/46.013
(58) Field of Classification Search .............. 372/43.01
See application file for complete search history.

(56) References Cited

U.S. PATENT DOCUMENTS

| | | |
|---|---|---|
| 5,475,701 A | 12/1995 | Hibb-Brenner |
| 5,625,636 A | 4/1997 | Bryan et al. |
| 5,978,401 A | 11/1999 | Morgan |
| 6,707,027 B2 | 3/2004 | Liess et al. |
| 6,717,972 B2 | 4/2004 | Steinle et al. |
| 6,813,293 B2* | 11/2004 | Johnson et al. ........ 372/46.015 |
| 2004/0264541 A1* | 12/2004 | Wang et al. ................. 372/99 |

FOREIGN PATENT DOCUMENTS

| | | | |
|---|---|---|---|
| WO | WO 02/37124 | 5/2002 | ...................... 3/36 |
| WO | WO 02/37410 | 5/2002 | ...................... 11/8 |
| WO | WO 02/37411 | 5/2002 | ...................... 11/8 |

OTHER PUBLICATIONS

Duijve, et al., "P-50.5L: A Compact, Laser-Based Optical Scrolling Device," SID 00 Digest, 2000, 4 pages.
Shinohara, et al., "Laser Doppler Velocimeter Using the Self-Mixing Effect of a Semiconductor Laser Diode," Applied Optics, Vo. 25, No. 9, May 1, 1986, pp. 1417-1419.
Koelink, et al., "Laser Doppler Velocimeter Based on the Self-Mixing Effect in a Fiber-Coupled Semiconductor Laser: Theory," Applied Optics, Vo. 31, No. 18, Jun. 20, 1992, pp. 3401-3408.
Jentink, et al., "Small Laser Doppler Velocimeter Based on the Self-Mixing Effect in a Diode Laser," Applied Optics, vol. 27, No. 2, Jan. 15, 1988, pp. 379-385.

* cited by examiner

*Primary Examiner*—Dung T. Nguyen
(74) *Attorney, Agent, or Firm*—Workman Nydegger

(57) ABSTRACT

A vertical cavity surface emitting laser (VCSEL) optimized for use in self mixing applications. The VCSEL generally includes a bottom distributed Bragg reflector (DBR) mirror formed on a substrate. An active region is formed on the bottom mirror. A top DBR mirror is formed on the active region. A trench is formed in the at least the top mirror. An aperture is oxidized into the VCSEL. At least one of the bottom DBR mirror, the top DBR mirror, the metal contacts, the trench, and/or the aperture is optimized to make the VCSEL more thermally sensitive to changes in current through the VCSEL.

30 Claims, 5 Drawing Sheets

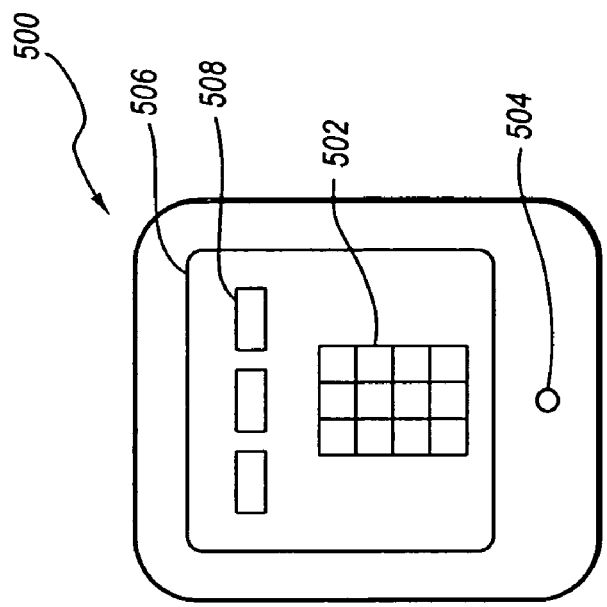
Fig. 5
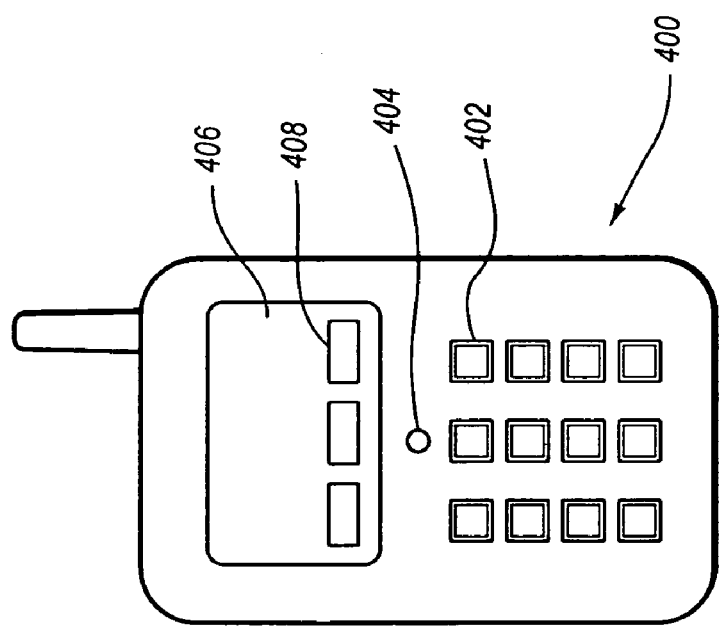
Fig. 4
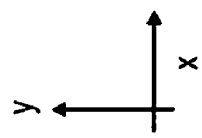

VERTICAL CAVITY SURFACE EMITTING LASER OPTIMIZED FOR THERMAL SENSITIVITY

CROSS-REFERENCE TO RELATED APPLICATIONS

This application claims the benefit of U.S. Provisional Application No. 60/605,875, titled "Vertical Cavity Surface Emitting Laser Optimized For Thermal Sensitivity" filed Aug. 31, 2004, which is incorporated herein by reference and is a continuation in part of prior application Ser. No. 10/877,915, titled "Light Emitting Device With An Integrated Monitor Photodiode", filed Jun. 25, 2004 now U.S. Pat. No. 7,184,454, which is incorporated herein by reference.

BACKGROUND OF THE INVENTION

1. The Field of the Invention

The invention generally relates to lasers used in sensor applications. More specifically, the invention relates to lasers used in applications facilitating changes in laser characteristics as the junction temperature changes.

2. Description of the Related Art

Lasers are becoming more widely used in many applications. Lasers may be used as a light generating source in fiber-optic communication applications. Laser light may also be used in various sensor applications, such as for example, self mixing applications.

Self mixing applications make use of laser power reflected back into the laser cavity and more especially into the active region. This reflected laser power changes the output of the laser. The output of the laser may be changed such as by changing the wavelength of the laser or by causing the laser output to be modulated in various beat patterns. A change in the wavelength of the laser, however, may be almost undetectably small. Thus the change in the wavelength may be detected as a shift in phase of an optical signal.

By continuously monitoring output from the laser, information can be gathered about conditions external to the laser. For example, using appropriate modulation and digital signal processing, information can be gathered about the distance of objects from a laser, movement of objects about the laser and the like. This allows the laser to be used in applications such as imaging, linear measurements, cursor pointers and the like. Methods of using lasers in self mixing applications are described in more detail in U.S. Pat. No. 6,707,027 titled "Method Of Measuring The Movement Of An Input Device" issued to Liess, et al. on Mar. 16, 2004, which is incorporated herein by reference.

Self mixing applications make use of a laser's sensitivities to temperature and reflected light to achieve the self mixing functionality. For example, by varying the temperature of the laser, the frequency of the laser light that is output by the laser can be varied. Thus, temperature variations can be used to create chirp, i.e., a controlled increase and decrease in frequency, which can be used in a Doppler Effect range and motion sensor. When portions of a chirped signal are reflected back into the laser active region, the laser changes its output characteristics. These output characteristics can be detected to determine various actions that are occurring outside the laser as described above.

Unfortunately, lasers used in self mixing applications are typically manufactured with characteristics that counteract some of the sensitivities to reflected light or that counteract attempts to modulate the temperature, and hence the frequency, of the laser. For example, lasers are generally constructed to eliminate or reduce light reentering the laser cavity. Further, lasers are generally constructed to operate at a given temperature and to dissipate heat quickly so as to avoid changes in the laser wavelength.

BRIEF SUMMARY OF THE INVENTION

One embodiment is directed towards a vertical cavity surface emitting laser (VCSEL). The VCSEL includes a bottom distributed Bragg reflector (DBR) mirror formed on a substrate. An active region is on the bottom mirror. A top DBR mirror including a trench is on the active region. Metal contacts are coupled to the active region. An aperture is in the VCSEL. At least one of the bottom DBR mirror, the top DBR, the metal contacts, the trench, and/or the aperture are optimized to make the VCSEL more thermally sensitive to changes in current through the VCSEL.

Another embodiment is directed towards a method of manufacturing a VCSEL. The method includes forming a bottom DBR mirror on a substrate. An active region is formed on the bottom mirror. A top DBR mirror is formed on the active region. Metal contacts are connected to the active region. A trench is formed in at least the top mirror. An aperture is oxidized into the VCSEL. At least one of the bottom mirror, the top mirror, the metal contacts, the trench, and/or the aperture are formed so as to make the VCSEL more thermally sensitive to changes in current through the VCSEL.

Advantageously, some embodiments are more thermally sensitive to changes in current such that the output wavelength of the VCSEL can be controlled by modulating current through the VCSEL. The ability to control the output wavelength of the VCSEL may be useful in applications such as self mixing applications where an output "chirp" is used to sense conditions external to the VCSEL.

These and other advantages and features of the present invention will become more fully apparent from the following description and appended claims, or may be learned by the practice of the invention as set forth hereinafter.

BRIEF DESCRIPTION OF THE SEVERAL VIEWS OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which:

FIG. 4 illustrates a cell phone using a Doppler velocimetry optimized sensor;

FIG. 5 illustrates another cell phone application using a Doppler velocimetry optimized sensor;

DETAILED DESCRIPTION OF THE INVENTION

Figure 1:
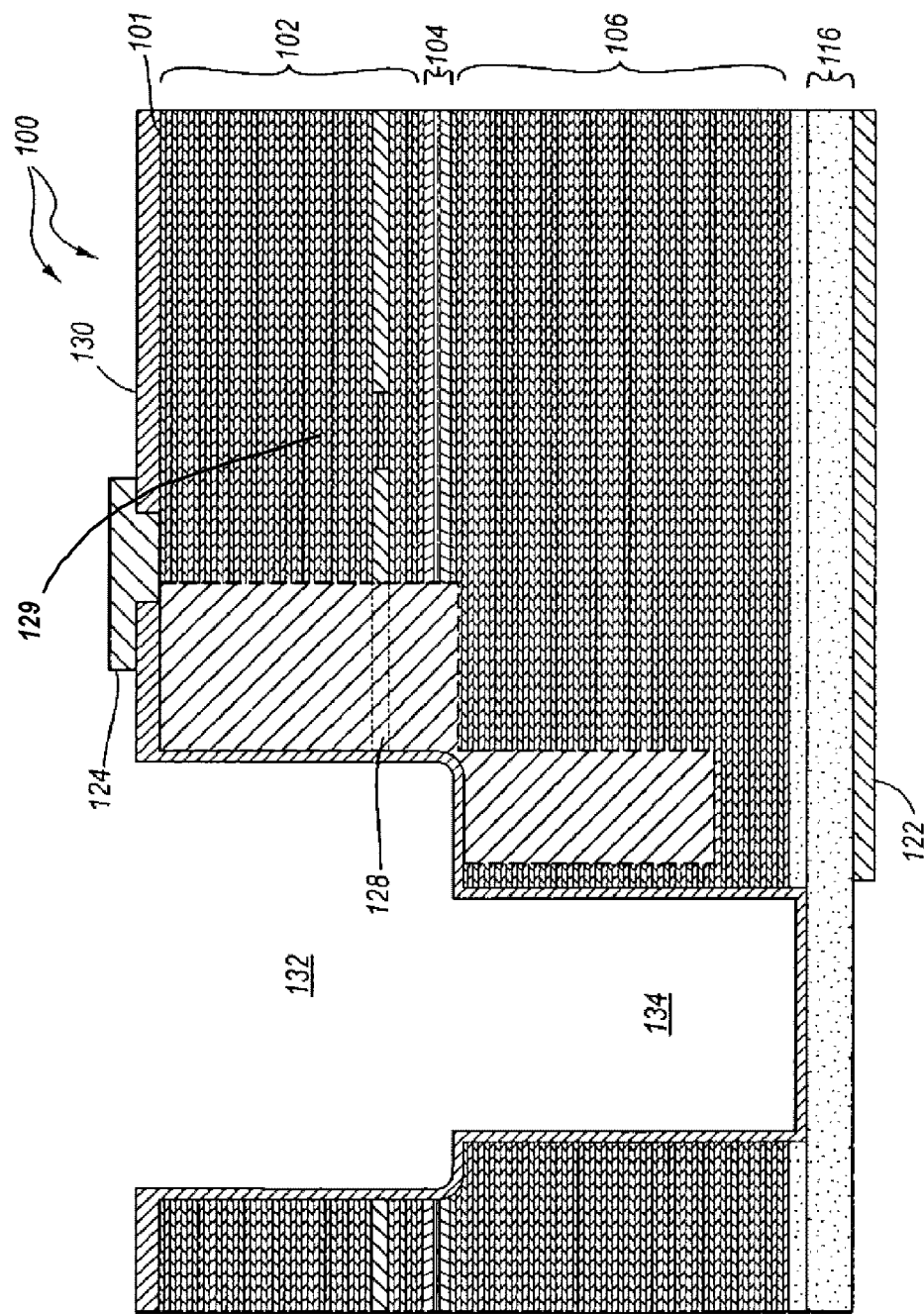
FIG. 1 illustrates a cross sectional view of a Vertical Cavity Surface Emitting Laser (VCSEL)

Embodiments described herein optimize laser characteristics including the laser thermal, electrical, and optical characteristics. Some embodiments described herein allow laser wavelength to be controlled by controlling the current through the laser to control the temperature of the laser. Further, some embodiments described herein allow reflected light to reenter the laser cavity.

Some embodiments may find particular usefulness in self mixing laser applications. Self mixing laser applications make use of laser power reflected back into the laser cavity and more especially into the active region. This reflected laser power changes the output of the laser. The output of the laser may be changed such as by changing the wavelength of the laser or by causing the laser output to be modulated in various beat patterns. A change in the wavelength of the laser, however, may be almost undetectably small. Thus the change in the wavelength may be detected as a shift in phase of an optical signal. By continuously monitoring output from the laser, information can be gathered about conditions external to the laser. For example, using appropriate modulation and digital signal processing, information can be gathered about the distance of objects from a laser, movement of objects about the laser and the like. This allows the laser to be used in applications such as imaging, linear measurements, cursor pointers and the like.

The laser output may be modulated by increasing and decreasing the wavelength of the beam output by the laser, for example by changing the temperature of the laser. Thus, if the temperature of the laser can be controlled, the wavelength output from the laser can also be controlled. By modulating the laser wavelength, a chirp, e.g. rising and falling frequencies, can be used in a Doppler effect detector.

In some embodiments, a structure is fabricated to optimize or enhance the effects of reflections, temperature changes and the like. Additionally, changes in the thermal and/or electrical characteristics of a structure can be useful for allowing the laser wavelength to be modulated by a bias current applied to the laser.

One optimization involves optimizing optical characteristics of the laser such as by allowing more light to be reflected from outside the laser into the active region. Other optimizations include changing the thermal conductivity/ resistance or thermal mass characteristics of the laser to optimize sensitivity to temperature changes resulting from applied current. Similarly, some optimizations may increase the electrical resistance of the laser. An increase in electrical resistance allows an increase in a bias current to cause a corresponding increase in heat dissipated which can be used to control the temperature of the laser. Still other optimizations alter the threshold current versus temperature operating characteristics to change the characteristics of the laser by optimizing the linewidth enhancement factor. An optimized linewidth enhancement factor can increase a VCSELs sensitivity, at the active region of the VCSEL, to external reflections.

Prior to elaborating on optimizations that may be used in a VCSEL structure to increase the sensitivity of the VCSEL; some discussion will be directed to general characteristics of a VCSEL epitaxial structure. Referring now to FIG. 1, an example of a VCSEL 100 that includes layers formed on a wafer substrate is shown. In one embodiment, the VCSEL 100 is grown using a GaAs wafer. However, other III-V (three-five) semiconductor combinations may also be used. The VCSEL 100 in the example shown includes a top mirror 102, an active region 104, and a bottom mirror 106. A PN junction, which forms a diode, exists in the active region 104. The VCSEL structure 100 is generally grown using a metal organic chemical vapor phase deposition (MOCVD) process.

The top mirror 102 is a distributed Bragg reflector (DBR) that generally comprises a number of alternating layers with high and low indexes of refraction. This creates a mirror with high reflectivity, around 99.5% in this example. In the example shown, the top mirror is constructed of p type materials such as carbon doped aluminum gallium arsenide (AlGaAs), where the fraction of Al can vary from 0% to 100%. The top mirror 102 includes about 20 mirror periods where each period includes a high index of refraction layer and a low index of refraction layer.

The active region 104 includes a number of quantum wells for stimulating the emission of laser energy. In the embodiment shown, the active region 104 is less than 1 micron thick.

Below the active region is a bottom mirror 106. The bottom mirror is comprised of about 30 to 35 doped n type mirror periods. Silicon is one example of a dopant that may be used in the bottom mirrors.

The VCSEL 100 has metal contacts that are used to supply current to the VCSEL for stimulating the emission of laser energy. A top contact 124 is used to connect a supply to the p type top mirror 102. A bottom contact 122 is connected to the n type bottom mirror 106.

The following optimizations are particularly well suited for self mixing applications. These optimizations for use in self mixing applications will now be discussed with continued reference to FIG. 1. While characterized as optimizations, the term "Optimize" as used in this description and the following claims, does not require that the components be optimized to their absolute optimal configuration, but rather that the components be fabricated so as to increase sensitivity to reflections and thermal changes. FIG. 1 illustrates optimizations for self mixing applications to increase the sensitivity of a VCSEL to light reflections, temperature changes and the like. FIG. 1 illustrates a vertical cavity surface emitting laser (VCSEL) 100.

Optical Characteristic Optimization

One method of increasing the sensitivity of the VCSEL 100 is by fabricating the VCSEL 100 to allow more light to be reflected into the active region 104. This may be done by changing the doping levels of the alternating layers in the top mirror 102 to be more lightly doped. This causes the top mirror 102 to be more translucent to light reflected back into the active region 104.

By reducing the doping in the alternating layers of the top mirror 102, electrical resistance is increased. This causes the VCSEL 100 to run at a higher temperature. Thus by reducing the doping in the top mirror 102, sensitivity of the VCSEL 100 is compounded by the combined effects of a more translucent top mirror 102 allowing more reflections back into the active region 104 and increased temperature sensitivity of the VCSEL 100. Temperature sensitivities will be covered in more detail below.

The translucence of the VCSEL 100 may also be optimized by appropriately selecting the thickness of a dielectric layer 130 on the top mirror 102. Ordinarily, it is desirable to make the top mirror 102 as reflective as possible. However, in self mixing applications it may be desirable to make the top mirror 102 less reflective and more translucent. To make the top mirror 102 more translucent, the dielectric layer 130 can be designed such that its thickness is a multiple of an odd quarter wavelength. For example, the thickness of the dielectric layer 130 may be selected such that the thickness is $$\frac{2n+1}{4}\lambda$$

2n+1/4λ where n is an integer and λ is the wavelength of design for the laser. Optimizing the dielectric layer 130 allows for other thicknesses to be used depending on the desired opaqueness of the top mirror 102.

Thermal Characteristic Optimization

Another way of increasing the sensitivity of the VCSEL 100 is by changing the thermal characteristics of the epitaxial layers. More particularly, it may be desirable to increase the sensitivity of the VCSEL 100 to temperature variations so as to be able to control modulation of the output wavelength of the VCSEL 100. Optimizations of thermal characteristics may fall into different categories, such as for example, optimizations to thermal impedance and optimizations to thermal mass.

Thermal impedance is a measure of a devices ability to conduct heat. The less able a device is to conduct heat, the quicker the temperature will rise in the device as heat is applied. For example, if a device is less conductive of thermal energy, a given level of bias current will cause the operating temperature of the device to rise more quickly. This causes a corresponding change in the wavelength at which the device, such as a VCSEL operates.

Thermal mass is a measure of a components temperature rise for a given amount of heat. A greater thermal mass means that the temperature does not increase as rapidly for a given amount of heat and the temperature change occurs more slowly. One way of increasing thermal mass is by increasing the physical mass of the device or by increasing connections to devices capable of dissipating heat. For example, connecting a heatsink, such as a large piece of metal with a large amount of surface area increases the thermal mass. In some embodiments of the invention, such as self mixing applications, it is desirable to reduce the thermal mass to optimize wavelength changes based on current changes in the VCSEL.

To make the VCSEL 100 more sensitive to temperature variations by decreasing thermal mass, the contacts such as contacts 124, 122 may be optimized by minimizing their physical size to reduce their heatsinking effect. In one embodiment, the contacts are designed to be a reduced size sufficient for carrying an amount of current needed to appropriately bias and power the VCSEL 100.

In one embodiment, the contact metal for the contacts 124, 122 is about less than 1 micron thick. It may be desirable to make the metal inner diameter as large as possible. Optimally the metal inner diameter is several microns larger than the oxide aperture 129. The metal inner diameter may be in one embodiment 2 microns larger than the oxide aperture 129. The metal outer diameter is as small as possible to minimize the total thermally conductive area. In one embodiment, the outer diameter is about 15 microns larger than the inner diameter.

One way of increasing thermal sensitivity in the VCSEL 100 by decreasing thermal conductivity is by forming a trench around the active region. This prevents some amount of thermal conduction from heat generating parts of the VCSEL 100 to other materials that may provide heatsinking functionality. In one embodiment, forming a trench may be accomplished by optimizing the shallow trench 132 to extend below the active region 104. In the example shown in FIG. 1, by extending the shallow trench 132 below the active region 104, the VCSEL becomes more sensitive to temperature variations. The shallow trench 132 may be further optimized by selecting an appropriate diameter of the shallow trench 132. The diameter of the shallow trench 132 may be reduced so as to reduce the thermal mass of the VCSEL 100. In one embodiment, the diameter of the trench may be about 25 microns.

Another method of optimizing the thermal conductivity of the VCSEL 100 is by selecting an appropriate construction of the bottom mirror 106. The mirrors may be formed of alternating low and high index of refraction layers. Notable, binary type materials, i.e., those formed from two elements, are more thermally conductive than ternary type materials, i.e., those formed from three elements. In FIG. 1, the high index of refraction layers and low index of refraction layers in the bottom mirror 106 are AlGaAs where the Al fraction may be selected from the range from 0% to 100%. The lower refractive index layers have a higher Al fraction. By forming a number of ternary layers, such as AlGaAs near the active region and keeping binary layers such as AlAs and GaAs layers, if present, further from the active region, the thermal conductivity can be decreased. In one embodiment, mirror periods are 10% AlGaAs and 85% AlGaAs in the top mirror and part of the bottom mirror closest to the active region. In the remainder of the bottom mirror the alternating layers are 10% AlGaAs and 100% AlAs. This helps to create a reasonably high thermal conductivity with a low thermal mass.

Yet another method of optimizing the thermal conductivity for self mixing applications of the optoelectronic device involves increasing the number of mirror periods in the mirrors 102, 106. This causes a decrease in the thermal conductivity of the VCSEL 100. To maintain an appropriate reflectivity of the mirrors 102, 106, it may be useful to vary the Al/Ga ratio in the individual mirror periods to maintain a total desired reflectivity for all of the mirror periods when combined to form the mirrors 102, 106.

Thermal conductivity and thermal mass are balanced so as to preserve the ability to change temperature, and thus wavelength, quickly. Namely, if thermal mass is decreased, the thermal impedance can be increased and if the thermal impedance is increased, the thermal mass can be decreased. In self-mixing applications, a chirp is generated by varying the wavelength of the VCSEL 100 across some range of frequencies. The ability to change temperature quickly allows the wavelength to be ramped smoothly along the range of frequencies.

Increasing the electrical impedance of a device generally causes more heat to be generated in the device for a given current. For a constant thermal mass and thermal conductivity, increases in heat generated increases operating temperature. As mentioned above, one way of increasing the electrical impedance is by reducing the doping in the top mirror 102. A similar reduction in the doping in the bottom mirror 106 will have a similar effect.

Another method of optimizing the electrical impedance of the VCSEL 100, is by controlling the size of the aperture 129. By growing an oxidized region 128 further into the VCSEL 100 structure, the opening of the aperture 129 is decreased thereby decreasing the area available for current flow through the VCSEL 100. This in turn increases the electrical impedance of the VCSEL 100. By controlling the electrical impedance of the VCSEL 100, current controls can be used to regulate the heat generated by the VCSEL 100 and therefore the operating temperature of the VCSEL 100.

Yet another method of optimizing the electrical impedance of the VCSEL 100 is by increasing the number of mirror periods in at least one of the top and bottom mirrors. Increasing the number of mirror periods increases the number of interfaces. The interfaces are responsible for a large portion of the electrical impedance.

Linewidth Enhancement Factor Optimization

One optimization alters the characteristics of the laser so as to change the threshold current versus temperature operating characteristics, which affects the linewidth enhancement factor. The linewidth enhancement factor correlates real and imaginary indices of refraction in the VCSEL. Functionally, the linewidth enhancement factor can be used to define how a VCSEL gain reacts to reflections directed into the VCSEL.

Figure 2:
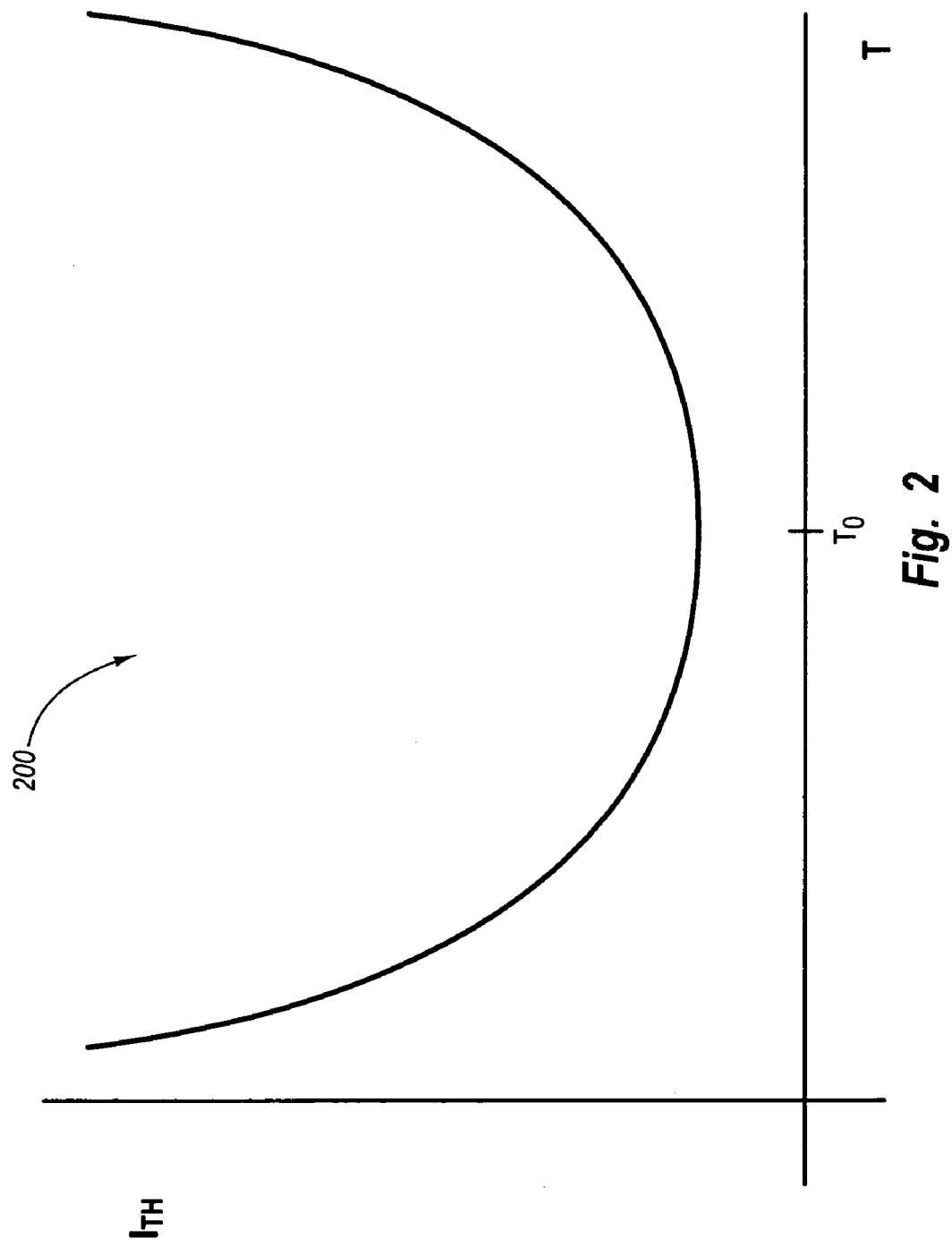
FIG. 2 illustrates a temperature versus threshold current curve.

Referring now FIG. 2, a curve 200 is shown that illustrates the relationship between the threshold current and the operating temperature of a VCSEL. Shown on the curve 200 is a point $T_0$ where the threshold current for the VCSEL is at its lowest value with respect to the temperature. By adjusting $T_0$ to higher values relative to the expected operating temperature, a VCSEL can be optimized for sensitivity in self mixing applications.

Figure 3:
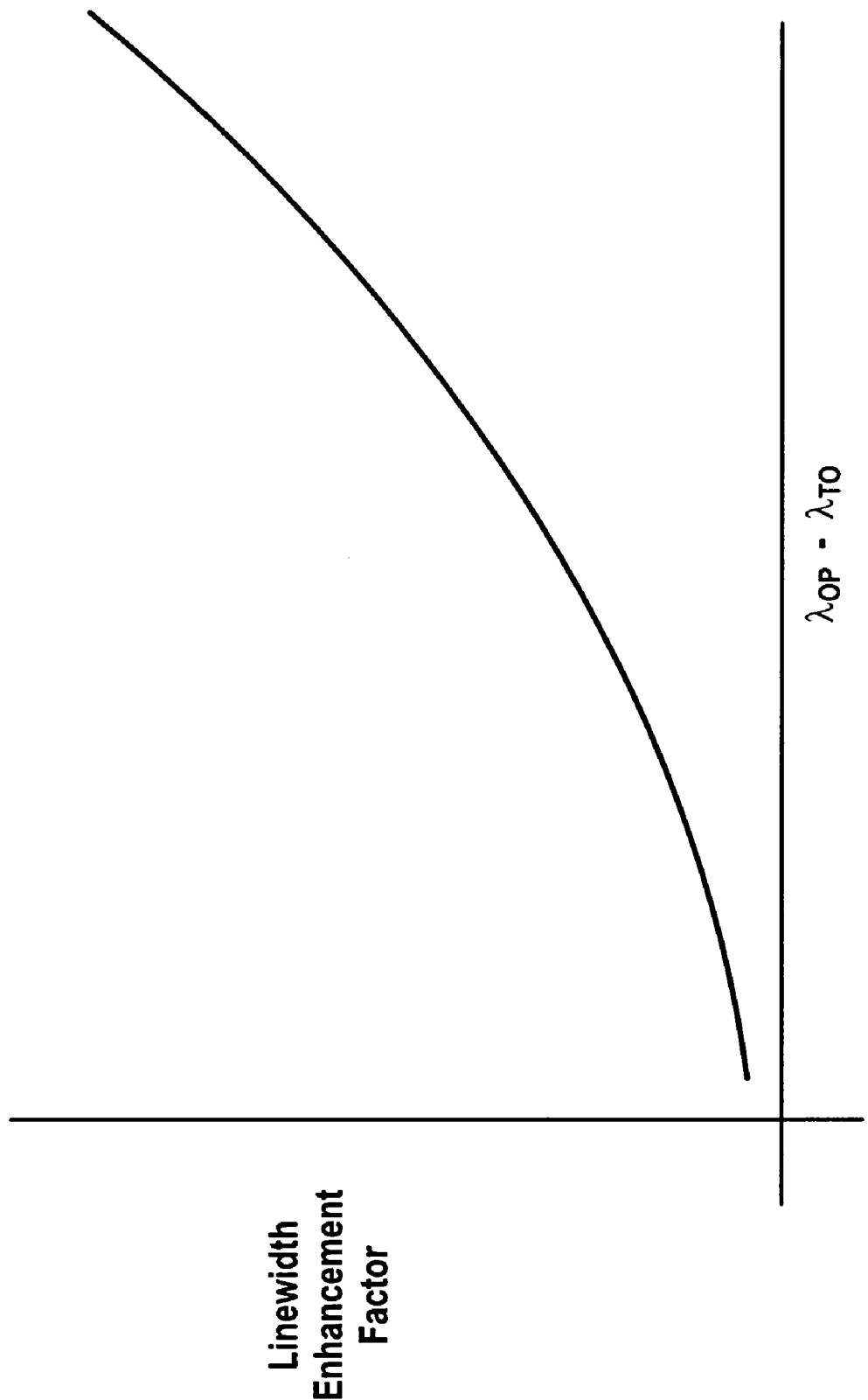
FIG. 3 illustrates a linewidth enhancement factor curve.

FIG. 3 illustrates a correlation of linewidth enhancement factor versus the wavelength of the VCSEL at the operating temperature ($\lambda_{OP}$) minus the wavelength of the VCSEL at $T_0$ ($\lambda_{T_0}$). As illustrated by the graph of FIG. 3, the linewidth enhancement factor is increased as $T_0$ is moved above the operating temperature.

Embodiments of the invention may be implemented in various configurations. One exemplary configuration, among many various possible configurations, is directed towards an implementation where a VCSEL and a photodiode are integrated monolithically. One example of such a configuration is described in U.S. patent application Ser. No. 10/877,915 titled "Light Emitting Device With An Integrated Monitor Photodiode", filed Jun. 25, 2004, which is incorporated herein by reference.

Exemplary Applications of Optimized VCSEL Structures

VCSELs optimized as outlined above can be used in various applications. Embodiments described herein include applications including a sensor based on laser Doppler velocimetry. Laser Doppler velocimetry is discussed in U.S. Pat. No. 6,707,027 titled "Method Of Measuring The Movement Of An Input Device" issued to Liess, et al. on Mar. 16, 2004, which is incorporated herein by reference. Laser Doppler velocimetry involves feedback light reentering a laser cavity and altering the way a laser lases. This may also be referred to as self mixing. By continuously monitoring output from the laser, information can be gathered about conditions external to the laser. For example, using appropriate modulation and digital signal processing, information can be gathered about the distance of objects from a laser, movement of objects about the laser and the like. In the embodiments described herein embodiments include a sensor optimized to make the sensor more sensitive to external conditions.

Self mixing applications make use of a laser's sensitivities to temperature and reflected light to achieve the self mixing functionality. For example, by varying the temperature of the laser, the frequency of the laser light that is output by the laser can be varied. Thus, temperature variations can be used to create chirp, i.e., a controlled increase and decrease in frequency, which can be used in a Doppler Effect range and motion sensor. When portions of this chirp are reflected back into the laser active region, the laser changes its output characteristics. These output characteristics can be detected to determine various actions that are occurring outside the laser as described above The following exemplary, but not limiting list, represent just a few of the applications that such optimized VCSELs may be used in.

Optical Mouse Devices

In today's digital world, personal computers are commonplace. Nearly every business utilizes at least one computer, and many businesses provide computers for each employee. Additionally, many homes have one or more personal computers and in some cases personal-computers for each individual in the home. Because computers are widely used, it is desirable that human interfaces to computers be simple and trouble-free. Those with expertise in computers seek for devices that are reliable, fast and inexpensive. Computer novices do not have the skills necessary to effectively cope with devices that are inaccurate or unreliable.

One device that is almost universal on all desktop computers and many laptop computers is the computer mouse. A computer mouse is typically an oblong shaped device with one or more conveniently located buttons. The computer user moves the mouse on a flat service such as a desk to move a cursor on the computer screen. When the cursor is over an icon or section of the screen that the computer user is interested in, the computer user can click the button to start an application, select data, direct a computer program's operation and the like.

Originally, a computer mouse included a rubber ball on the bottom of the mouse that would roll along at the flat surface. The rubber ball was connected to two wheels where each wheel represented an X and Y coordinate for directing the position of a cursor on a computer screen. The computer mice with the rubber wheel suffered from the unfortunate drawback of debris such as lint, dust and dirt being picked up by the rubber wheel and causing contamination on the two wheels thereby causing accuracy and reliability problems with the computer mice.

The next generation of computer mice includes optical mice. Optical mice are currently the most commonly used mice. Optical mice use a light emitting diode to illuminate the flat surface. A camera in the optical mouse then takes a picture of the flat surface. As the mouse moves, the optical mouse takes successive pictures and performs algorithms to determine what movements of a mouse are required to account for the differences in the successive pictures. The movements that are required are then converted to a signal that is fed into the computer that causes the cursor on the computer screen to move in a fashion similar to the movements required to account for differences in successive pictures. One problem that arises with the use of optical mice is inaccuracies or the inability of the mice to detect movement when the mouse is used with a flat surface with a repeating pattern. When a pattern on the flat surface repeats, it may be difficult for the computer mouse to determine what movements were needed to account for the differences in successive pictures.

Additionally, optical mice have difficulties in detecting movement when the mouse is moved so quickly that successive pictures do not have common elements. In other words, if successive pictures do not share some of the same features of the flat surface, no comparison can be made between the successive pictures and thus no calculation can be performed to determine what movements are required from the mouse to account for the differences in the successive pictures.

Embodiments described below overcome these drawbacks. An optical mouse may be implemented using a VCSEL optimized as described above. Namely, a VCSEL optimized for self-mixing applications may be included in a computer mouse. Using Doppler velocimetry, movement of the mouse along a desktop could be detected. The detected movement could be separated into its x and y axis constituents and used to control, for example cursor movement on a computer screen.

In addition to uses that detect movement of the mouse, optimized VCSELs may also be used as buttons and scroll wheels on the top side of the mouse. Because the optimized VCSELs, when used in Doppler velocimetry applications, can be used to detect movements in the z direction, the VCSELs could be used to detect finger movements on the mouse akin to present day clicking motions. Further, VCSELs could be used to detect present day scrolling motions that have heretofore been accomplished with rubber coated scroll wheels. Using optimized VCSELs eliminates moving parts that may be subject to wear and contamination. Additionally a scroll function (up and down movement) and a pan function (side to side movement) could be implemented using a single optimized VCSEL as opposed to multiple scroll wheels or switches.

Mobile Telephone Handset Sensors

Cellular telephones (cell phones) have become a common tool employed by many. Cell phones allow individuals to be accessible or to have access to others in virtually any location at any time. Modern cell phones use digital technology including digital processors and digital memory in their functionality. It is therefore, not surprising that cell phone functionality has been extended to include functionality implemented by other digital devices. For example, many cell phones include digital address books for storing contact information including telephone numbers, addresses and notes. Further, email and internet functionality is often included in many cell phone devices.

While functionality of modern cell phones is ever expanding, cell phone designs are physically decreasing in size. Cell phones continue to become lighter and smaller. As cell phones become smaller, there is less space available for user input devices including a telephone keypad and other buttons. An optimized VCSEL using Doppler Velocimetry can be used to provide a compact interface to a cell phone.

Optimized VCSELs used in Doppler velocimetry applications allows for interaction with elements on a cell phone screen. Such elements may include icons, menu selections and the like. Movements of a finger across the sensor cause elements to be selected or highlighted. Integrating the ability to access multiple functions in a single user input device allows for less space to be used for the user input device while still making increased functionality of the cell phone available to users.

Referring now to FIG. 4, one embodiment is illustrated where a cell phone 400 incorporates a traditional keypad 402 with a touch sensor 404. The cell phone 400 includes a screen 406 with various elements 408. By selecting various elements 408 on the screen 406, various functions can be selected. For example, an address book, email client, or Internet browser may be accessed.

In the example shown, the screen 406 has elements 408 arranged in a plane defined by x and y directions. The sensor 404 can detect movement in x and y directions and thus select elements 408 in the plane. Further, the sensor can detect movement in a z direction. In the example shown in FIG. 4, the z direction is out of the page. When z-direction movement is detected by the sensor 404, the z-movement may be interpreted as a selection of a highlighted element 408. For a user, this action may be similar to a "click" or "double-click" action performed when using a conventional mouse device. While the example shown in FIG. 4 illustrates the sensor 404 on the front of the cell phone 400, the sensor 404 may be located on the side of the cell phone or at any other convenient location.

FIG. 5 illustrates an example of a cell phone 500 where the keypad functionality has been implemented as a virtual keypad 502. Similar to the example shown in FIG. 4, the keypad 502 and other elements 508 are controllable on the screen 506 through user interaction with an optimized VCSEL sensor used in a Doppler velocimetry application.

Paper Positioning Sensors

The inexpensive nature of modern computing equipment has made this computing equipment widely available. Most homes and offices have at least one computer. These computers allow data to be quickly generated and retrieved. For example, a user can quickly generate a text document using word processing software included on the computer. Using the Internet, vast amounts of data can be retrieved to the computer.

There is often a need to generate a "hard copy" of data generated on or retrieved to a computer. This is typically done by printing the data on standard sizes of paper using a printer attached to the computer. To ensure that the printer prints on the paper, and at the correct location on the paper, the printer may include various sensors that sense the position of the paper. If the paper is positioned in the proper location, a print head, in the case of an ink-jet printer, or a toner wheel, in the case of a laser printer, will apply printing to the paper.

Paper positioning in printing devices may be accomplished by using a VCSEL sensor optimized as described above and used with a Doppler velocimetry system. The paper positioning sensor may be, for example, implemented near the print head of a printer for detecting paper boundaries and position.

Linear Measurement Devices

Several different measuring devices exist for measuring distances. For example, tape measures and rulers are among the more common distance measuring devices. Other devices include wheels where a distance is measured depending on how many times the wheel rotates. One example of this type of measuring device is an odometer such as is common in modern automobiles.

While many such measuring devices are common, measuring devices with other features are desirable. For instance, it may be desirable to measure distances and lengths in locations where it is not convenient to use a fixed ruler. Illustratively, it may be desirable when measuring curved surfaces to use a device that facilitates measuring around the curved surface as opposed to tape measures and rulers that are relatively inflexible.

Another example when other types of measurements are useful is when there is a need to measure the amount of a product dispensed or the length of a tool such as a length of fish tape. It is often desirable to measure the amount of a product dispensed from a reel. For example, it may be desirable to measure the amount of cable, wire, string, and like dispensed from a reel of such product. It is typically not convenient to measure such lengths using devices such as rulers and tape measurers. While device employing a wheel that rotates may be used, they may have accuracy problems due to mechanical changes in wheel size, wear on other mechanical parts, or the inability to measure small increments.

When using a fish tape, an electrician runs the fish tape through a finished wall or through conduit. Once the fish tape is through the wall or conduit, the electrician attaches a length of cable or wire to the fish tape. The fish tape is then pulled back through the wall or conduit so that the cable can be routed through a facility for providing electrical service, communication cables and the like in the facility. It is desirable to know the amount of fish tape that has been dispensed so the electrician can ensure that a sufficient amount of cable or wire is attached to the fish tape. The correct amount of cable or wire is needed because it may be difficult or illegal to splice additional cable or wire to the end of a cable or wire being pulled by fish tape.

Figure 6:
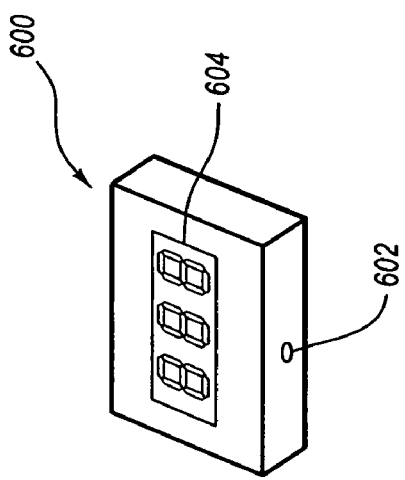
FIG. 6 illustrates a linear distance sensor using a Doppler velocimetry optimized sensor.

Referring now to FIG. 6, one example of a linear measuring device embodied as a linear tape measure 600 is shown. The linear tape measure 600 includes a sensor 602. The sensor 602, in this example includes a VCSEL optimized for use in self-mixing, Doppler velocimetry applications. The sensor 602 is coupled to circuitry in the linear tape measure that monitors the output of the VCSEL and calculates movement of the VCSEL across a surface. Thus, to operate the linear tape measure 600, the sensor is run substantially linearly across a surface. The present embodiment, while described as a linear measuring device, may also be used to follow a surface contour or a non-linear path on a surface.

The circuitry in the linear tape measure 600 is coupled to a display 604. The display 604 may be used to output a reading showing a measurement. The measurement value may be calculated by the circuitry and displayed in various units including both English and metric units. The linear tape measure 600 may include other user interactive components such as buttons and the like to allow a user to zero a device, select units and the like. In one embodiment, the user interactive components may also be a VCSEL optimized for use in self-mixing, Doppler velocimetry applications. Specifically, the VCSEL optimized for use in self-mixing, Doppler velocimetry applications can sense movement towards and way from the VCSEL such as movement that is detected by a switch.

Figure 7:
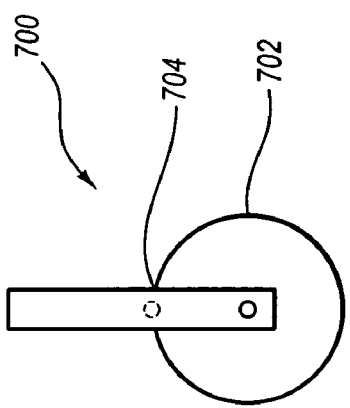
FIG. 7 illustrates a rotational measurement device using a Doppler velocimetry optimized sensor.

Referring now to FIG. 7, another embodiment in shown that includes a rotational measurement device 700 including a measuring wheel 702. As the measuring wheel rotates past a sensor 704, distances can be measured. This type of device may be installed in automobiles for use in speedometers and odometers or in other devices where rotational distances can be measured.

Figure 8:
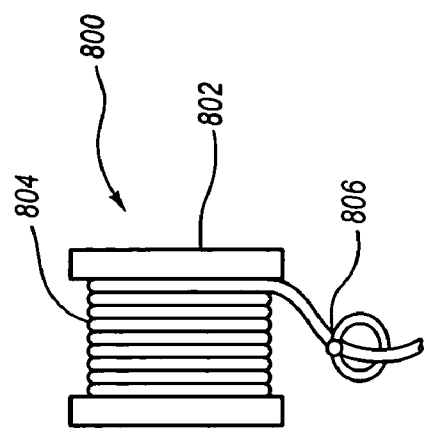
FIG. 8 illustrates a cable distribution measuring system using a Doppler velocimetry optimized sensor.

Referring now to FIG. 8, a cable distribution and measuring system 800. A spool 802 includes cable 804 wound about the spool. The cable 804 may be, for example, electrical cable, fiber-optic cable, rope, fish tape, and the like. The cable passes by a sensor 806 that includes a VCSEL optimized for Doppler velocimetry. This system 800 can be used, therefore, to measure the amount of cable product or cable tool that passes by the sensor 806.

Appliance Control Screen Sensors

In the modern home, many appliances and other equipment have become more user interactive. Modern electronics allows appliances to perform a multitude of task that were previously not able to be performed. Thus, appliances have become more flexible and versatile. Much of the versatility in modern appliances is possible because of microprocessor control and sensors that are now commonly available. For example, a modern washing machine may now allow a user to select from a number of different washing cycles. Washing cycles may exist for different kinds of stains and/or clothing types. Some cycles may even exist that vary temperatures throughout a cycle to account for multiple types of cleaning that need to be performed during a single cycle. While there exists much more versatility in choosing functions of modern appliances, there also exists much more decision making that must be performed when choosing functionality.

Keeping in mind that the typical home user may not be educated in electronic technology or computer control algorithms, it is desirable to maintain user interfaces with appliances that are simple and intuitive to use. Even users with formal training in electronics may have difficulty using an appliance if the controls of the appliance are not intuitive.

One type of user interface that allows a user to make intuitive decisions uses touch screen technology. Touch screen technology allows an appliance to display a number of choices on a screen. The user can then select a choice by physically touching the screen using a stylus or finger to make selections. In one example, the appliance uses a wizard interface. A wizard interface allows the user to successively make choices about the type of functionality that is desired. For example the user interface will present the user with a choice, such as in the washing machine example, the choice to choose between darks, medium or lights. Either depending on the user's choice or independent of the user's choice, the appliance then presents another choice such as heavy soil, medium soil or light soil. A wizard interface continues in this fashion until enough user choices have been made to enable the appliance to perform some particular functionality.

One drawback with touch screen technology is cost. Typically, a touch screen is fabricated from a liquid crystal display (LCD) which are usually prohibitively expensive for most appliances. While a touch screen would be useful for many appliances including toasters and the like, touch screens are typically only implemented on high-end models of expensive appliances such as washing machines and dryers.

Additionally, a touch sensitive membrane is placed on the LCD to sense the selection by using a finger or stylus. The touch sensitive membrane may be damaged by use with sharp or dirty objects.

Another type of user interface that is commonly used with home appliances is a push-button interface. Using a push-button interface, a user presses one or more push-buttons to perform some particular functionality. Generally, push-button interfaces are economically made such that there are few push-buttons that are part of the interface. To use advanced functionality of an appliance, the pushbuttons must be pressed simultaneously or in some specified order. However, the order or buttons that must be pressed is often not immediately obvious. Thus, users may only utilize the functionality of the appliance that is most intuitive and/or requires the fewest button presses, thereby underutilizing the functionality of the appliance.

Using a VCSEL sensor optimized as described above for Doppler velocimetry, an interface to an appliance can be inexpensively implemented. In one embodiment, the need for a touch sensitive membrane could be eliminated by using the sensor in a circuit for manipulating cursor position on a screen. Alternatively, the sensor could be used to manipulate LEDs or other indicators. The sensor could also be used as a selection device to confirm a particular setting on the appliance.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A VCSEL for use in self mixing applications, the VCSEL comprising:
    a bottom DBR mirror formed on a substrate;
    an active region formed on the bottom mirror;
    a top DBR mirror formed on the active region;
    metal contacts coupled to the active region;
    a trench formed in at least the top mirror, the trench extending through at least a portion of the bottom DBR mirror so as to make the VCSEL more thermally sensitive to changes in current through the VCSEL;
    an aperture oxidized into the VCSEL; and
    a dielectric layer formed on the top DBR mirror, the thickness of the dielectric layer being a multiple of an odd quarter wavelength of the beam.

2. The VCSEL of claim 1 wherein at least one of the top and bottom mirrors is optimized to make the VCSEL more thermally sensitive to changes in current through the VCSEL by having an increased number of mirror periods in at least one of the top and bottom mirrors to increase the electrical impedance of the VCSEL.

3. The VCSEL of claim 1 wherein at least one of the top mirror and bottom mirror is optimized to make the VCSEL more thermally sensitive to changes in current through the VCSEL by having a decreased doping to increase the electrical impedance of the VCSEL.

4. The VCSEL of claim 1 wherein the trench is optimized to extend below the active region to reduce the thermal conductivity of the VCSEL.

5. The VCSEL of claim 1 wherein the diameter of the trench is reduced to reduce the thermal mass of the VCSEL.

6. The VCSEL of claim 5, wherein the diameter of the trench is about 25 microns.

7. The VCSEL of claim 1, wherein at least one of the metal contacts is of a reduced size so as to decrease a thermal mass of the VCSEL.

8. The VCSEL of claim 1, wherein the bottom mirror comprises alternating high and low index of refraction layers wherein the low index of refraction layers comprise non-binary semiconductor materials directly below the active region and binary semiconductor materials a predetermined distance below the active region to reduce thermal conductivity.

9. The VCSEL of claim 1, wherein the aperture is oxidized to a size so as to increase the electrical impedance of the VCSEL.

10. The VCSEL of claim 1, wherein the top mirror comprises alternating layers of high and low index of refraction and wherein the top mirror is optimized to make the VCSEL more thermally sensitive to changes in current through the VCSEL by reducing doping in alternating layers of the top mirror to increase the electrical impedance of the VCSEL.

11. A sensor for use in Doppler velocimetry applications, the sensor comprising a VCSEL as set forth in claim 1.

12. An optical mouse comprising a sensor as set forth in claim 11.

13. A telephone handset comprising a sensor as set forth in claim 11.

14. A paper positioning device comprising a sensor as set forth in claim 11.

15. A linear measurement device comprising a sensor as set forth in claim 11.

16. The linear measurement device of claim 15, wherein the linear measurement device is configured to measure a length of fish tape.

17. An appliance comprising a sensor as set forth in claim 11.

18. The VCSEL of claim 1, wherein the trench extends to the substrate.

19. A VCSEL for use in self mixing applications, the VCSEL comprising:
    a bottom DBR mirror formed on a substrate;
    an active region formed on the bottom mirror;
    a top DBR mirror formed on the active region;
    metal contacts coupled to the active region;
    a trench formed in at least the top mirror, the trench extending through at least a portion of the bottom DBR mirror so as to make the VCSEL more thermally sensitive to changes in current through the VCSEL; and
    an aperture oxidized into the VCSEL;
    wherein the bottom DBR mirror comprises an upper portion and a lower portion, the upper portion being disposed closer to the active region than the lower portion, the upper portion and the lower portion comprising alternating high and low index of refraction layers, the low index of refraction layers in the upper portion comprising non-binary semiconductor materials and the low index of refraction layers in the lower portion comprising binary semiconductor materials.

20. The VCSEL of claim 19, further comprising a dielectric layer formed on the top DBR mirror, the thickness of the dielectric layer being a multiple of an odd quarter wavelength of the beam.

21. The VCSEL of claim 19, wherein at least a portion of the high index of refraction layers and low index of refraction layers in the bottom DBR mirror comprise AlGaAs having an Al content of between 0% and 100% and wherein the low index of refraction layers have a higher fraction of Al than the high index of refraction layers.

22. The VCSEL of claim 19, wherein the top DBR mirror comprises alternating high and low index of refraction layers, and wherein the alternating layers of the top DBR mirror and the upper portion of the bottom DBR mirror comprise about 10% AlGaAs and about 85% AlGaAs, and the alternating layers of the lower portion of the bottom DBR mirror comprise about 10% AlGaAs and about 100% AlAs.

23. A VCSEL for use in self mixing applications, the VCSEL comprising:
    a bottom DBR mirror formed on a substrate;
    an active region formed on the bottom DBR mirror;
    a top DBR mirror formed on the active region;
    metal contacts coupled to the active region, the metal contacts each having a thickness, an inner diameter, and an outer diameter;
    a trench formed in at least the top DBR mirror;
    an aperture oxidized into the VCSEL,
    wherein
        the thickness of at least one of the metal contacts is less than about 1 micron; or the inner diameter of at least one of the metal contacts is at least 2 microns larger than the aperture; or the outer diameter of at least one of the metal contacts is at least about 15 microns larger than the inner diameter of the same metal contact.

24. A sensor for use in Doppler velocimetry applications, the sensor comprising a VCSEL as set forth in claim 23.

25. An appliance comprising a sensor as set forth in claim 24.

26. The appliance of claim 25, wherein the appliance comprises one of an optical mouse, a telephone handset, a paper positioning device, and a linear measurement device.

27. A VCSEL for use in self mixing applications, the VCSEL comprising:

a bottom DBR mirror formed on a substrate;

an active region formed on the bottom DBR mirror;

a top DBR mirror formed on the active region;

metal contacts coupled to the active region;

a trench formed in at least the top DBR mirror, the diameter of the trench being about 25 microns to decrease a thermal mass of the VCSEL;

an aperture oxidized into the VCSEL.

28. A sensor for use in Doppler velocimetry applications, the sensor comprising a VCSEL as set forth in claim 27.

29. An appliance comprising a sensor as set forth in claim 28.

30. The appliance of claim 29, wherein the appliance comprises one of an optical mouse, a telephone handset, a paper positioning device, and a linear measurement device.

* * * * *